United States Patent
Brocato et al.

(10) Patent No.: US 10,886,841 B1
(45) Date of Patent: Jan. 5, 2021

(54) PASSIVE HIGH-POWER-DENSITY GRID INTERFACE DEVICE

(71) Applicant: National Technology & Engineering Solutions of Sandia, LLC, Albuquerque, NM (US)

(72) Inventors: Robert W. Brocato, Sandia Park, NM (US); Jason C. Neely, Albuquerque, NM (US); Lee Joshua Rashkin, Albuquerque, NM (US); Jarod James Delhotal, Albuquerque, NM (US); Jack David Flicker, Albuquerque, NM (US); Robert Kaplar, Albuquerque, NM (US); Joshua Stewart, Blacksburg, VA (US); James Richards, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days.

(21) Appl. No.: 16/384,107

(22) Filed: Apr. 15, 2019

Related U.S. Application Data

(60) Provisional application No. 62/658,409, filed on Apr. 16, 2018.

(51) Int. Cl.
*H02M 3/07* (2006.01)
*H05K 7/20* (2006.01)
*H02M 1/32* (2007.01)
*H02M 1/00* (2006.01)

(52) U.S. Cl.
CPC ............ *H02M 3/073* (2013.01); *H02M 1/32* (2013.01); *H05K 7/20909* (2013.01); *H02M 2001/0003* (2013.01); *H02M 2001/0058* (2013.01); *H02M 2003/077* (2013.01)

(58) Field of Classification Search
CPC .................. H02M 3/073; H02M 1/32; H02M 2001/0003; H02M 2001/0058; H02M 2003/077; H05K 7/20909
See application file for complete search history.

(56) References Cited

U.S. PATENT DOCUMENTS

| 8,737,093 | B1* | 5/2014 | Baker | H02M 3/07 307/82 |
| 9,929,654 | B2* | 3/2018 | Ferdowsi | H02M 3/158 |
| 10,193,541 | B1* | 1/2019 | Williams | H03K 17/063 |
| 2002/0196646 | A1* | 12/2002 | Cook | H02M 7/003 363/141 |

(Continued)

OTHER PUBLICATIONS

Albanidi, A. et al., "A Novel High Gain DC-DC Full-Bridge Converter for Low Voltage Renewable Energy Applications," Canadian Conference on Electrical and Computer Engineering (CCECE), ON, Canada, May 2017, 4 pages.

(Continued)

*Primary Examiner* — Dinh T Le
(74) *Attorney, Agent, or Firm* — Martin I. Finston

(57) ABSTRACT

A hybrid switched capacitor power converter for high-power applications is provided. The converter has a transistor-switched input-stage boost converter followed by a capacitor-and-diode ladder circuit. The converter is adapted to produce an output voltage of at least 5 kV at a power level of at least 0.5 kW. The ladder circuit includes one or more multi-stage rails.

16 Claims, 6 Drawing Sheets

(56) References Cited

U.S. PATENT DOCUMENTS

| | | | | |
|---|---|---|---|---|
| 2005/0243579 A1* | 11/2005 | Jang | ..................... | H02M 3/335 363/16 |
| 2013/0163302 A1* | 6/2013 | Li | ......................... | H02M 3/07 363/127 |

OTHER PUBLICATIONS

Delhotal, J. et al., "Design and Control Methodology for Improved Operation of a HV Bipolar Switched Capacitor Converter," IEEE Workshop on Wide Bandgap Power Devices and Applications (WiPDA), Albuquerque, NM, Oct. 2017, 7 pages.

Delhotal, J. et al., "Design & Control Methodology for Improved Operation of a HV Bipolar Hybrid Switched Capacitor Converter," Sandia National Laboratories, SAND2017-12291C, 22 pages.

Liao, Z. et al., "A GaN-based Flying-Capacitor Multilevel Boost Converter for High Step-up Conversion," 2016 Energy Conversion Conference and Exposition (ECCE), Milwaukee, WI, Sep. 18-22, 2016, 7 pages.

Seeman, M. D., "A Design Methodology for Switched Capacitor DC-DC Converters", Dissertation for Electrical Engineering and Computer Sciences, University of California at Berkeley, UCB/EECS-2009-78, May 21, 2009, p. 112-116.

Stewart, J. et al., "Design and Evaluation of a Hybrid Switched Capacitor Circuit with Wide-Bandgap Devices for Compact MVDC PV Power Conversion," Photovoltaic Specialists Conference (PVSC), IEEE-PVSC 44.2017, Washington, D.C. Jun. 2017, 6 pages.

Stewart, J. L., "Design & Evaluation of a Hybrid Switched Capacitor Circuit with Wide-Bandgap Devices for DC Grid Applications," Dissertation for Electrical Engineering, University of New Mexico, Albuquerque, NM, Jul. 2017, http://digitalrepository.unm.edu/ece_etds/356, 76 pages.

Stewart, J., "Design & Evaluation of a Hybrid Switched Capacitor Circuit with Wide-Bandgap Devices for Compact MVDC PV Power Conversion," Sandia National Laboratories, Jun. 29, 2017, SAND2017-8997C, 13 pages.

Stewart, J. et al., "Design and Evaluation of Hybrid Switch Capacitor Converters for High Voltage, High Power Density Applications," Applied Power Electronics Conference (APEC), San Antonio, TX, Mar. 2018, 8 pages.

\* cited by examiner

PASSIVE HIGH-POWER-DENSITY GRID INTERFACE DEVICE

CROSS-REFERENCE TO RELATED APPLICATION

This application claims the benefit of U.S. Provisional Application No. 62/658,409, filed Apr. 16, 2018, under the title "Passive High-Power-Density Grid Interface Device", the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

ART BACKGROUND

Photovoltaic arrays and offshore wind farms can sometimes be located far from the localities that they will serve. In addition, output power generated by these and other renewable sources can vary widely in power level depending on local weather conditions. In order to decrease cost, it can be desirable to combine the outputs of all wind turbines in a wind farm to transmit the output power to land via a single high voltage DC transmission line.

The present electrical grid is predominantly AC in its implementation. One primary reason for this is that the AC transformer provides an efficient means of stepping voltages from higher to lower voltages or vice versa with a single, efficient, reliable component, i.e. the transformer. However, the use of high voltage DC rather than conventional AC enables the more efficient combination of sources with varying amounts of output power.

Also, medium voltage DC power distribution systems may have lower combined investment and operating costs than either low voltage or medium voltage AC power distribution systems. Part of the advantage arises from the simplicity of a medium voltage DC distribution system relative to either a low voltage or a medium voltage AC distribution system. The medium voltage DC distribution system has fewer components than either type of AC distribution system.

The potential savings achievable by means of implementing a hybrid AC/DC distribution grid is substantial. Energy savings for implementing such a grid could amount to 55 quads of energy by the year 2050.

A hybrid AC/DC distribution system can support an electrical grid with distributed power generation, where moderate amounts of power need to be transitioned from many power generation sites onto the grid. However, the power transmission cycle in such a system will typically involve a voltage boost step. It can be highly advantageous to utilize a passive DC grid interface device in the boost step of the power transmission cycle.

For example, the high installed cost of commercial and utility scale solar photovoltaic systems drives up the levelized cost of solar photovoltaic energy relative to other sources, making it difficult to meet state and utility renewable portfolio standards. The photovoltaic panels themselves account for only a small portion of the total cost.

However, changes to distribution architectures and converter designs that favor DC distribution and transmission (over AC) can potentially reduce the cost of photovoltaic integration. In part, this is because the voltage output of the photovoltaic panels is DC, and fewer components are needed when DC power is combined and transmitted without transformation to AC.

In addition, maintaining the output as a DC voltage as it is combined and transferred to the distribution system can be accomplished with lower energy loss. One possible implementation of this is shown in FIG. 1, which is a notional diagram of a hybrid switched capacitor converter in a DC power grid application. Medium voltage 100 and low voltage 110 sections are shown with a photovoltaic array 120 feeding its power output into the medium voltage section.

For commercial-scale and utility-scale distribution, DC-to-DC converters are needed that have high voltage gain, high conversion efficiency, and medium or high voltage DC (MVDC or HVDC) operation. However, the converters in current use that meet these requirements are complex and bulky. The field has lacked, until now, a suitable grid interface device that is compact and integrable so that it can potentially be treated, e.g., as a single component.

INCORPORATION BY REFERENCE

The entirety of each of the following publications is hereby incorporated herein by reference:

J. Delhotal et al, "Design and Control Methodology for Improved Operation of a HV Bipolar Switched Capacitor Converter," *IEEE Workshop on Wide Bandgap Power Devices and Applications (WiPDA)*, Albuquerque, N. Mex., October 2017.

J. Stewart et al., "Design and Evaluation of a Hybrid Switched Capacitor Circuit with Wide-Bandgap Devices for Compact MVDC PV Power Conversion," *SAND*2017-8997C, Sandia National Laboratories, Jun. 29, 2017.

J. Stewart et al., "Design and Evaluation of Hybrid Switch Capacitor Converters for High Voltage, High Power Density Applications," *SAND*2018-1394C, Sandia National Laboratories, February 2018.

M. D. Seeman, "A Design Methodology for Switched Capacitor DC-DC Converters", *Dissertation for Electrical Engineering and Computer Sciences*, University of California at Berkeley, UCB/EECS-2009-78, May 21, 2009.

SUMMARY OF THE INVENTION

A passive device capable of serving as an interface between a direct current (DC) power distribution grid and DC or alternating current (AC) power generating devices is described here. This device can be treated by the power system designer as a discrete component capable of providing the entire interface between power source and grid. It serves in a role analogous to that of a transformer in an alternating current (AC) power generation and distribution system. It was created to enable a DC power distribution grid in which electrical power at high DC voltage is distributed over long-range transmission lines.

In one embodiment, the device takes 10 kW of DC electrical power at 600 V from a photovoltaic array and steps it up to 10 kV DC for long-range power transmission.

Although the device was conceived for use as a general purpose electrical grid interface device, it can also be used for photovoltaic arrays, offshore wind power distribution, electric automobiles, electric aircraft, capacitor bank charging in pulsed power applications, electric ships, hand-held Tasers, electromagnetic accelerators, pulsed loads, and electrostatic speakers.

The device can be implemented using either silicon semiconductor devices or wide-bandgap (WBG) semiconductor devices based on materials such as SiC and GaN to enable high-speed switching of high voltage signals, in order to decrease size, weight and power.

Accordingly, the invention in one aspect relates to a hybrid switched capacitor power converter having a conversion capacity of at least 0.5 kW. The power converter includes a switched input-stage boost converter followed by a capacitor-and-diode ladder circuit having one or more multi-stage rails.

In some embodiments, at least the ladder circuit is integrated on a front surface of a planar substrate and conductively coupled through the planar substrate to a cooling arrangement on a back surface of the planar substrate.

In embodiments that we refer to as "bipolar" embodiments, the ladder circuit comprises at least one positive rail and at least one negative rail paired with a corresponding positive rail, and the output voltage of the power converter comprises a voltage drop between a positive rail output and a corresponding negative rail output. In some bipolar embodiments, the ladder circuit comprises a stack of rail pairs, each comprising a positive rail and a corresponding negative rail, and the output voltage is obtained by summing the voltage drops between the positive and negative outputs of the respective rail pairs.

The invention in another aspect relates to a method of DC-to-DC power conversion. Such method involves applying an input voltage of at least 200V to input terminals of a boost converter, converting the input voltage to an output voltage of at least 1000V with an efficiency of at least 90% by applying gain in the boost converter and applying further gain in a capacitor-and-diode ladder circuit connected downstream of the boost converter, and delivering a converted output power of at least 0.5 kW to a load connected across output terminals of the ladder circuit.

DETAILED DESCRIPTION

Figure 1:
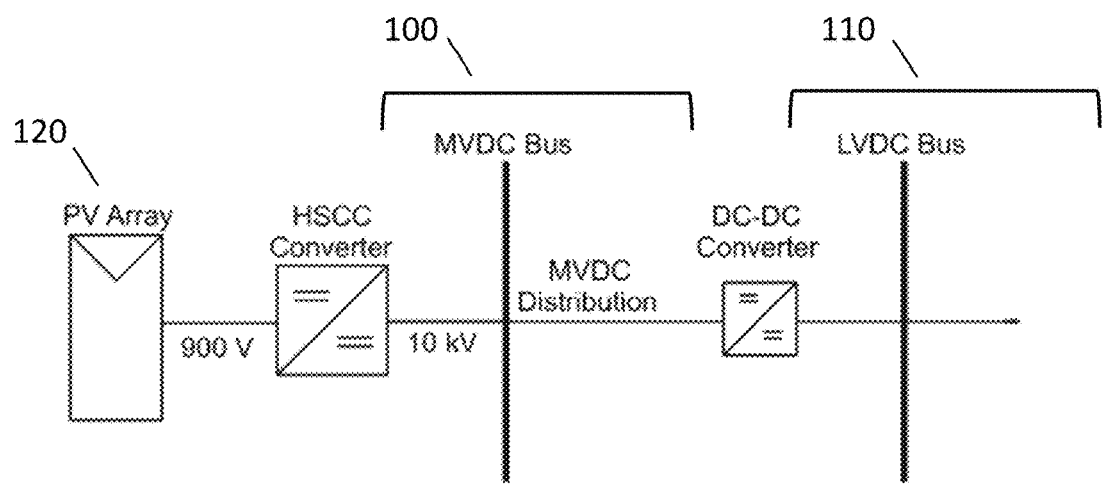
FIG. 1 is a notional diagram of a hybrid switched capacitor converter of the prior art in a DC power grid application.
Figure 2:
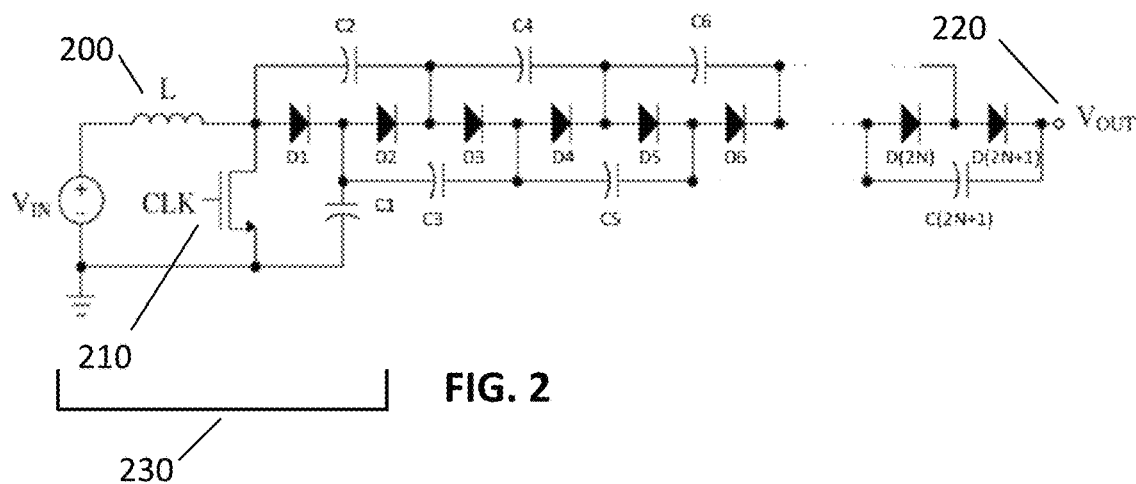
FIG. 2 is a simplified circuit diagram of a passive grid interface device according to the present invention in a simple embodiment.

A simple version of the device that we have created to accomplish the DC grid adaptation is shown in FIG. 2. In this simple embodiment, the N-section adapter consists of a single inductor 200, a single transistor switch 210, 2N+1 diodes D1, D2, . . . , D(2N+1), and 2N+1 capacitors C1, C2, . . . , C(2N+1), each having capacitance C. (In more complex designs, the capacitance values need not all be the same.) An output load capacitor (not shown in FIG. 2) also needs to be added between $V_{out}$ and ground, making for a total of 2N+2 capacitors in the adapter.

The entire grid adapter can be thought of as consisting of several pieces (FIG. 2). At the far left of the diagram is a single-transistor boost converter 230. It consists of a single transistor switch 210, a single diode D1, a single capacitor C1, and a single inductor 200. The boost converter is one of the standard topologies of DC-to-DC power converters and is used to increase (or, as the name implies, to boost) an input DC voltage up to a higher output DC voltage.

Figure 3:
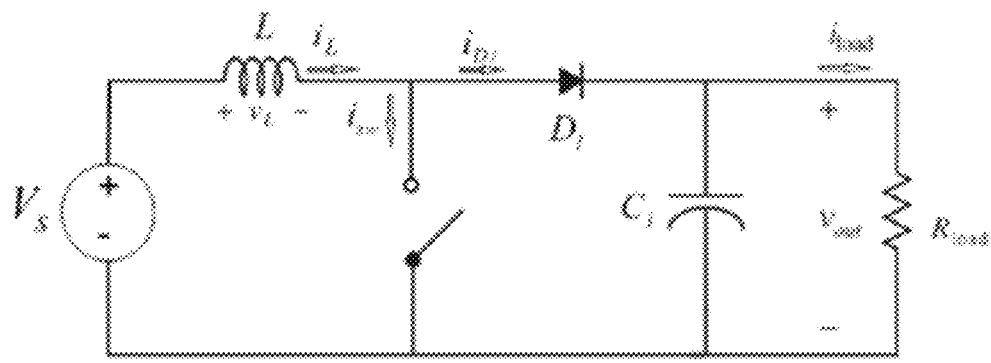
FIG. 3 is a simplified circuit diagram of a boost converter, such as the boost converter of FIG. 2, in operation as a standalone circuit.

Operating as a standalone circuit as shown in FIG. 3, the boost converter of FIG. 2 can step up the voltage of the input signal by a factor $V_{out}/V_{in}$ called the voltage gain of the converter. Within practical limits, the boost converter section can provide an unlimited voltage gain, depending on the duty cycle D of the clock signal applied to the transistor input. The voltage output of the boost converter operating as a standalone converter can be determined from the input voltage $V_{in}$ and the duty cycle D according to the following relation:

$$V_{out}=V_{in}/(1-D).$$

As this relation suggests, the output voltage increases rapidly as the duty cycle D approaches unity.

Although the output voltage continues to increase as D approaches unity, the power that can be effectively transferred through the boost converter section is limited. For a high-power converter, the voltage gain of the boost converter, given by 1/(1−D), is kept less than about 6. The voltage gain of the boost converter section is kept low to limit the stress on the transistor switch and output diode from the peak inductor current.

A passive element DC transformer is connected to the boost converter and formed in part from the boost converter. This passive element DC transformer is implemented by a hybrid switched capacitor converter (HSCC) as shown in FIG. 4.

Figure 4:
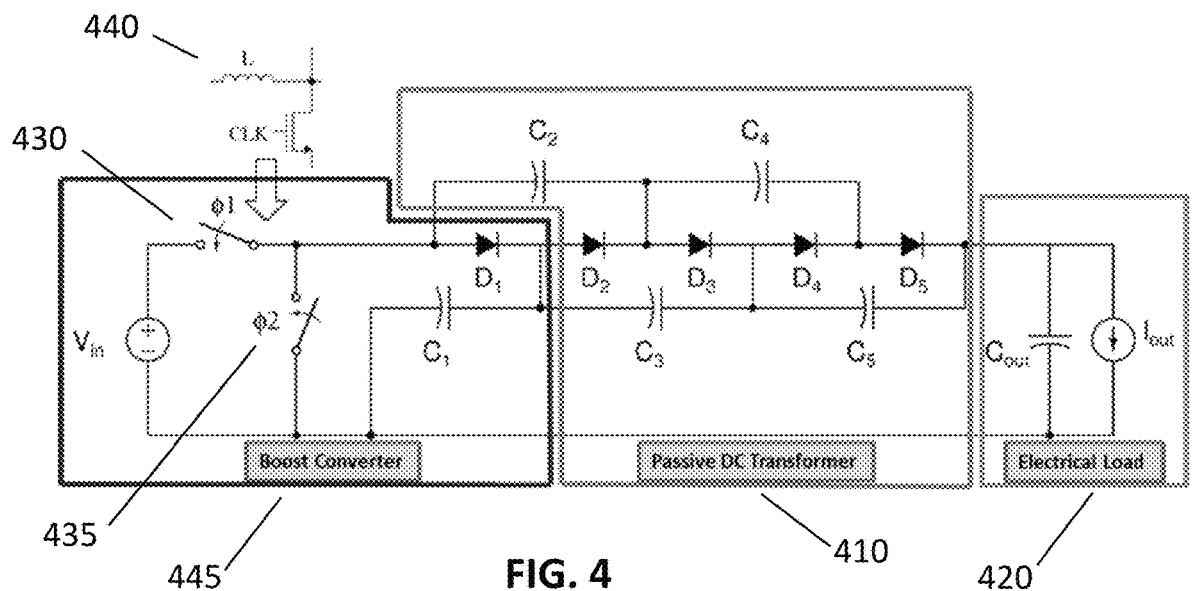
FIG. 4 is a simplified circuit diagram of a passive grid interface device, similar to the block diagram of FIG. 2. The circuit of FIG. 4 is shown subdivided into functional blocks. An inset shows the inductor and transistor switch of FIG. 2, but in the main part of FIG. 4, these components are symbolized by respective switch elements.

In FIG. 4, boost converter 445 is coupled to passive DC transformer 410 which, as shown, is implemented by a HSCC. An electrical load 420 is connected at the output of the HSCC. As indicated by inset 440, inductor 200 and transistor switch 210 (see FIG. 2) are represented in the main part of the figure by switch 430 and switch 435, respectively.

The passive element DC transformer 410 can also serve as a standalone DC-to-DC converter if a pair of switches 430, 435 as shown in FIG. 4 are added to it. If the passive element DC-to-DC converter is configured using a pair of transistor switches or a transistor and a diode switch, then it can be thought of as a switched capacitor (SC) converter, implementations of which have existed in industry for many years. (See, for example, J. Dickson, "On-Chip High-Voltage Generation MNOS Integrated Circuits Using an Improved Voltage Multiplier Technique," *IEEE Journal of Solid State Circuits*, vol. SC-11, no. 3, June 1976, pp. 374-378.)

The SC converter uses at least two switches, typically implemented by at least one transistor and one diode or by two transistors per stage, to produce an increased output voltage from an input voltage. Neglecting switch losses, the maximum output voltage of an N-stage SC converter is given by $$V_{out}=(N+1)V_{in}.$$

The output voltage in the above expression is for a capacitive load. For a load that draws a current $I_L$ and that is clocked with a period $T_s$, the output voltage is decreased by the effect of the current drawn by the load and is given by $$V_{out}=(N+1)V_{in}-N(I_L T_s)/C.$$

The passive element DC transformer uses a combination of diodes and capacitors to increase an output voltage over the input voltage by a process of charge shifting and combining similar to that of a multistage SC converter.

As the name implies, the passive element DC transformer contains no transistors or other three-terminal devices. Instead, it uses the single transistor and single inductor of the boost converter to provide switching signals for the DC transformer section.

By using the inductor 200 of the boost converter section 445 in place of the input diode or transistor switch of the conventional SC converter, the passive element DC transformer 410 increases converter voltage gain. It does this at a lower cost than an SC converter, since it uses at least one fewer transistor or diode. This cost savings can be considerable, since the transistors and diodes in a high-power converter are very expensive components.

Furthermore, the combined circuit shown in FIG. 4 can produce much higher output power than can a boost converter or an SC converter acting alone, or even a boost converter feeding directly into an SC converter in series.

These advantages are enabled by the key structural change of eliminating the input series switch used in an SC converter and instead allowing the boost converter's inductor to serve the function otherwise performed by that switch.

The switch transistor 210, in combination with the inductor 200 used in the boost converter, creates the charge-shifting signal that magnifies the voltage through the DC transformer.

To better grasp the operation of the DC transformer, it is helpful to envisage the inductor and transistor of the boost converter in their role as a substitute for the switches of an SC converter.

If the entire cycle time of the converter clock is represented by $T_s$, then the on time of the clock signal applied to the transistor switch is $DT_s$. This is the first phase φ1 of the clock, when the transistor switch 435 in the boost converter is on. The remainder of the cycle time is the off time $D'T_s$ of the clock signal applied to the transistor switch, where $D'=1-D$. During this off time, the transistor switch 435 is off and the inductor forces a current through diode $D_1$ and into capacitor $C_1$.

In FIG. 4, the "switch" 430 is shown in the open position, which corresponds to clock phase φ1, as will be explained below. The switch 435 is closed in clock phase φ1. In the figure, switch 435 is shown in the open position, which corresponds to clock phase φ2 (which is also explained below).

For the time period $D'T_s$, the inductor can be thought of as forming a second switch 430. This second switch runs on the phase of the clock referred to as φ2, which is the complement of phase φ1. However, the inductor acts differently from a switch in that it forces a current through $D_1$ and into $C_1$, whereas a switch would simply connect the voltage $V_{in}$ to the circuit constituted by $D_1$ and $C_1$.

Consequently, the inductor 200 with inductance L serves not only as a switch, but also as a current source of current I, by discharging a portion of its total stored energy $E_L$, given by:

$$E_L=\tfrac{1}{2}LI^2,$$

onto the capacitor $C_1$. This occurs during phase φ2 of the clock. The inductor forces a current through diode $D_1$ and onto capacitor $C_1$, storing a charge $\Delta Q$, at a voltage V onto $C_1$.

The charge that is transferred onto capacitor $C_1$ during the second clock phase φ2 is shifted onto capacitors $C_2$-$C_5$ and Coat by subsequent phase changes of the φ1 and φ2 pattern coming from the clock signal. Phase φ1 reoccurs when the clock signal turns on the transistor.

During φ1, the voltage source $V_{in}$ appears across the inductor and the resulting current through the inductor passes through the transistor to ground.

Also, during phase φ1, the anode of diode $D_1$ is grounded. The voltage from the charge stored on capacitor $C_1$ causes the diode $D_1$ to be back-biased, thus effectively creating an open circuit through that branch.

Also, during φ1, diode $D_2$ is forward biased by the voltage arising from the charge stored on capacitor $C_1$. The forward bias on diode $D_2$ effectively creates a short through that branch of the circuit.

In these calculations, the voltage drops across the forward-biased diodes and the on transistor have been neglected as, relatively speaking, they are much less than the voltage applied to each capacitor.

Figure 5:
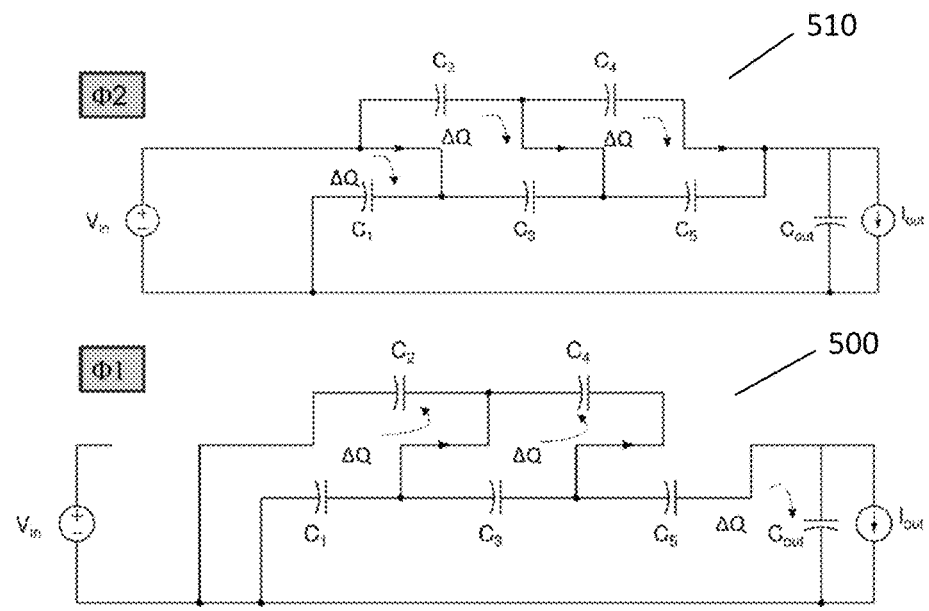
FIG. 5 shows respective phases φ1 (lower view) and φ2 (upper view) in the operation of the circuit of FIG. 4.

The circuit branches that are effectively shorted and opened during phases φ1 and φ2 are respectively shown in the lower view 500 and upper view 510 of FIG. 5.

During phase φ1, capacitors $C_1$ and $C_2$ are connected in parallel and capacitors $C_3$ and $C_4$ are connected in parallel. During phase φ2, capacitors $C_2$ and $C_3$ are connected in parallel and capacitors $C_4$ and $C_5$ are connected in parallel.

The charge $\Delta Q$ transferred onto $C_1$ during phase φ2 gives it an initial voltage V. This charge is transferred from capacitor $C_1$ to capacitor $C_2$ during phase φ1 (assuming all capacitors have the same capacitance value C).

Then, during the next instance of phase φ2, capacitor $C_2$ will transfer charge $\Delta Q$ to capacitor $C_3$, capacitor $C_4$ will transfer charge $\Delta Q$ to capacitor $C_5$, and so on up the ladder. During subsequent clock cycles, stored charge is transferred between successive stages during the first phase of the cycle, and then charge is replenished to the capacitor ladder from the inductor during the second phase of the cycle in the manner just described. At the end of the ladder, charge $\Delta Q$ is transferred onto the output capacitor $C_{out}$ during the first phase of the clock cycle.

During each clock cycle, independent of clock phase, the charge stored on capacitor $C_{out}$ is made available to the load.

The load current $I_{out}$ is related to the charge $\Delta Q$ stored on capacitor $C_{out}$ with a clock cycle $T_s$ by the expression, $$I_{out}=\Delta Q/T_s$$

One advantageous embodiment of this device uses two hybrid switched capacitor circuits, of the kind shown in FIG. 4. These are connected in a bipolar, dual rail configuration (see FIG. 6). That is, the dual rail configuration has two instantiations 600, 610 of the circuit shown in FIG. 4, but with one circuit 600 taking a positive input voltage and outputting a much higher positive voltage, while the other circuit 610 takes a negative input voltage and outputs a much lower negative voltage. The two circuit instantiations are connected along the ground rail 620, with each powering one half 630, 635 of the output load.

Figure 6:
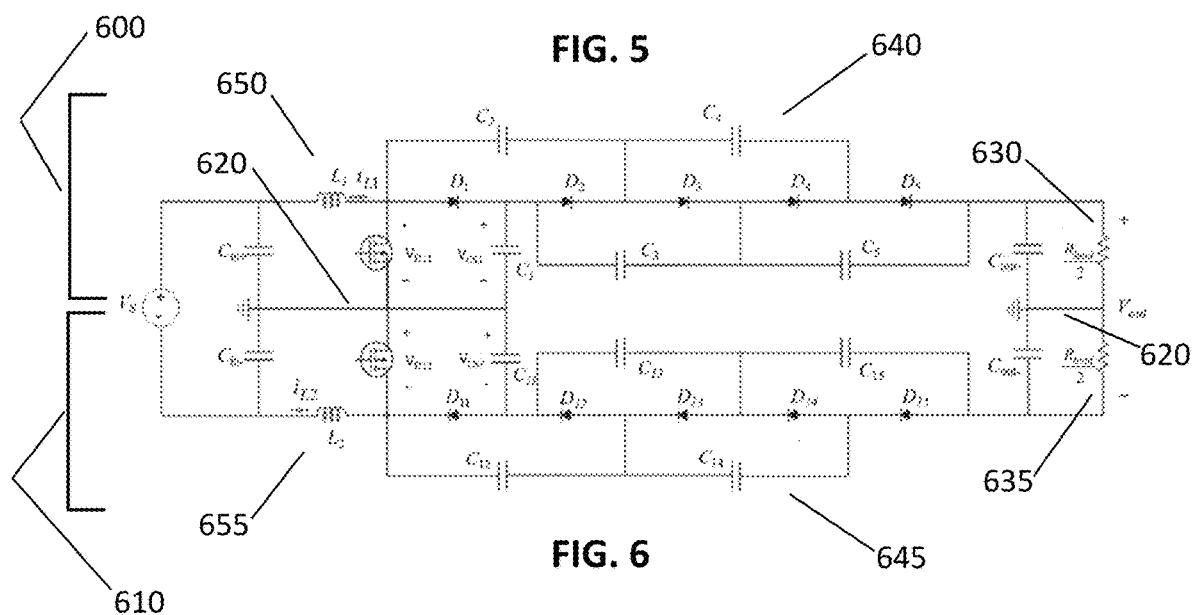
FIG. 6 is a simplified circuit diagram of a passive grid interface device in a bipolar, dual rail configuration according to an embodiment of the present invention.

In the dual-rail ladder topology shown in FIG. 6, each of the two rails consists of a four-stage switched capacitor ladder 640, 645. The complete device can produce twice the maximum output power, at the load, that can be produced by a single-rail version operating alone.

The bipolar configuration of FIG. 6 includes two boost converters 650, 655, each driving a respective DC transformer. Each of these boost converters alone would be able to step up the voltage from an input voltage of about 300V to about 1200V. In each of the "rails", i.e. in each of the two DC transformers, the four-stage diode-and-capacitor ladder further boosts the voltage from the 1200V fed into it to an output of 5000V.

At the output end, the two multistage DC transformer circuits can be connected in series to provide a doubled output voltage. In FIG. 6, for example, the total voltage difference between the positive and negative output terminals is shown being applied across the total output load resistance, with a midpoint ground connection.

Accordingly, the arrangement shown in FIG. 6 can convert an input (between the output terminals of the boost converters) of 600V into an output of 10,000V. This is the output voltage needed for MVDC applications. The output voltage and power of a single, unipolar version, as shown in FIG. 4, for example, would be too low to meet the requirements for such an application.

Likewise, a standalone boost converter would generally be unsuitable for applications in MVDC power conversion, even though boost converters are common in many other applications. Because as a practical matter the duty cycle is limited to about 80%, a typical stand-alone boost converter will have a maximum voltage gain of only about 5. Although a boost converter with a gain as high as 16.7 has been reported, that arrangement required two transformers to be added as snubbers for the switch legs. Thus, the high gain was achieved only at the cost of additional large transformers. (See A. Alganidi et al., "A Novel High Gain DC-DC Full-Bridge Converter for Low Voltage Renewable Energy Applications," *Canadian Conference on Electrical and Computer Engineering (CCECE)*, ON, Canada, May 2017.)

As noted above, the respective positive and negative rail outputs in the configuration of FIG. 6 are connected in series with a midpoint ground. With a modification in the illustrated circuits, the respective outputs can be floated. This raises the possibility that within practical limits, any number of rails can be stacked in series to multiply the output voltage beyond the twofold increase achieved in the configuration of FIG. 6.

Figure 7:
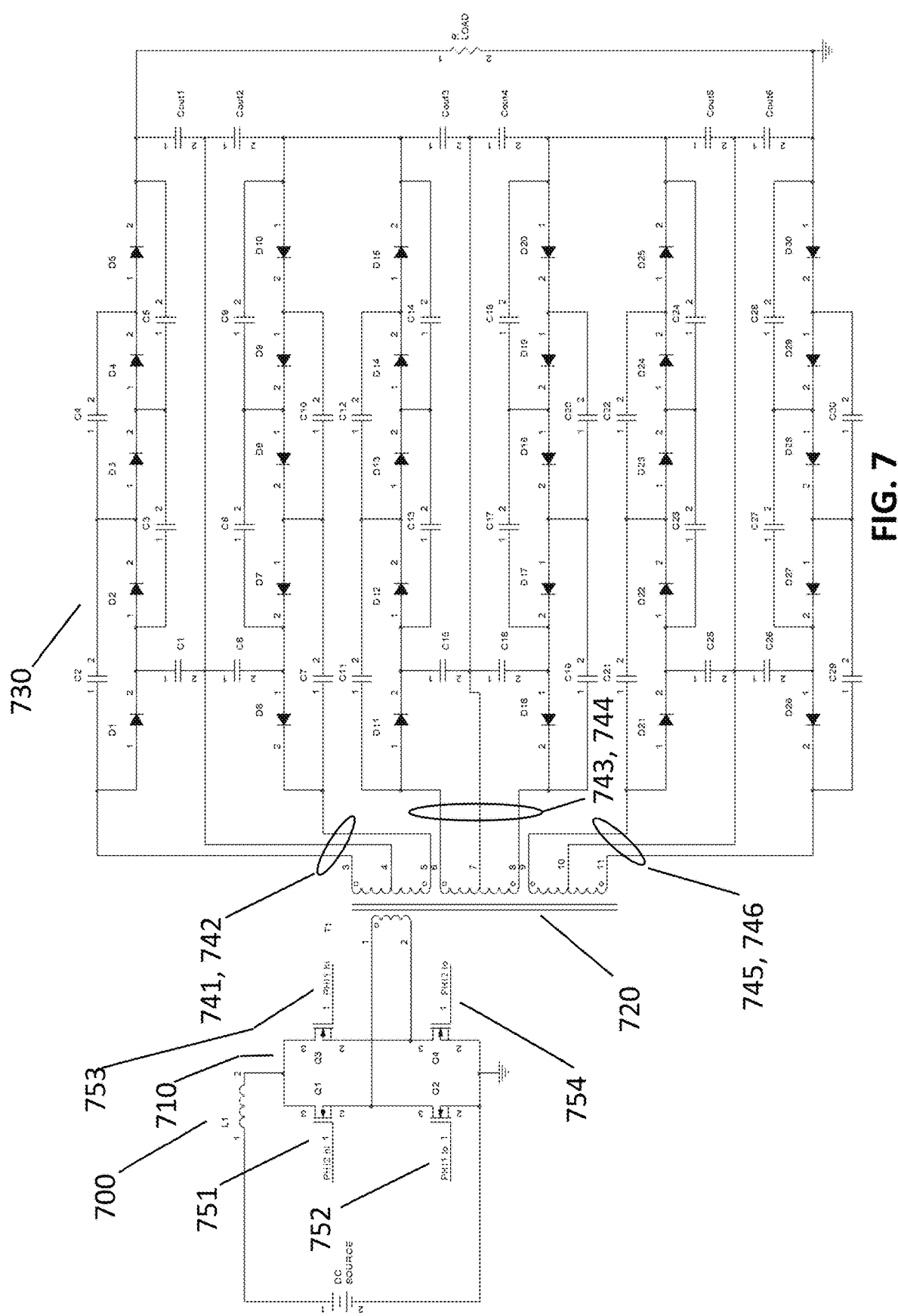
FIG. 7 is a simplified circuit diagram of a passive grid interface device according to an embodiment of the present invention that includes multiple, stacked rails. The six rails shown in the example of FIG. 7 are arranged in three pairs such that there are a positive and a negative rail in each pair. As shown in the figure, each pair also has a current return line that serves, in effect, as a floating ground.

For example, FIG. 7 is a diagram of a circuit in which the boost converter consists of an inductor 700, a 4-transistor bridge 710, and an AC transformer 720. Catch diodes, which are needed to suppress flyback when the boost converter is operated, form part of the ladder section 730. This approach enables multiple rails 741-746 to be stacked.

In the embodiment shown in FIG. 7, a total of six rails are stacked. However, there is no fundamental limit to the number of rails that can be stacked. In FIG. 7, the rails are arranged in three pairs such that there are a positive and a negative rail in each pair. As shown in the figure, each pair also has a current return line that serves, in effect, as a floating ground.

The pairs are stacked in series to build up output voltages at the load. By stacking rails in this manner, it is possible to build a converter that can greatly exceed the voltage and power ratings for the individual capacitors or diodes used in the rails.

The AC transformer 720 used for the boost portion of the converter shown in FIG. 7 can be of relatively small size if it is operated at a very high frequency. In such a circuit, transistors and diodes based on wide bandgap semiconductors are preferable because they can enable high frequency operation.

Although it would be typical for the switching transistors to be field-effect transistors (FETs). However, other types of transistors could be used, and in fact, alternative type of switching elements could be used in place of transistors. Examples of alternative switching elements include, without limitation, insulated-gate bipolar transistors (IGBTs), bipolar junction transistors (BJTs), krytrons, and silicon-controlled rectifiers (SCRs).

With reference to FIG. 7, the signals 751-754 shown going to the gates are complementary control signals. They are clocked by a common clock oscillator (not shown in the figure).

Figure 8:
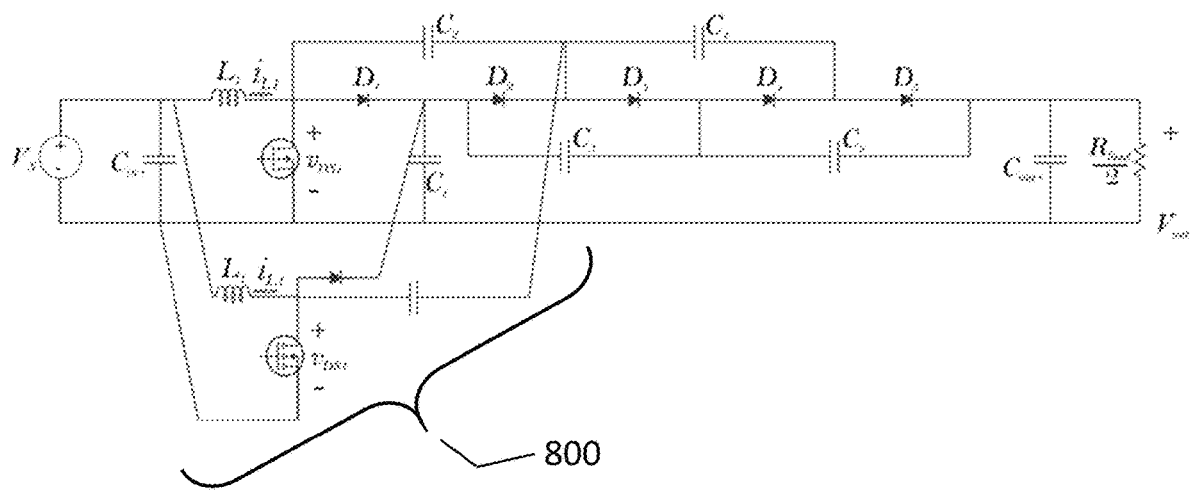
FIG. 8 is a simplified circuit diagram of a passive grid interface device according to an embodiment of the present invention. In the circuit shown, parallel-connected components are added to a single-rail circuit to alleviate electrical stress.

Within a given rail, the most heavily stressed components will generally be those at the lower voltage levels of the switched capacitor ladder, as shown on the left-hand side of the ladder diagram, where peak device currents are higher. To alleviate some of this stress, an interleaving technique may be used to add additional, parallel-connected components. For example, FIG. 8 is a single-rail circuit diagram showing an added circuit branch 800 that duplicates inductor $L_1$, the switching transistor, and diode $D_1$ of the boost converter, as well as capacitor $C_2$.

Another possible improvement is to add a capacitor across each of the transistor switches or across each of the inductors. Such a capacitor is referred to as a snubber capacitor. With either placement, the snubber capacitor mitigates turn-off losses in the active switch, thereby improving converter efficiency.

The converter can be connected in a power grid only if the flow of input power is controlled. We have found that the input power is advantageously controlled by controlling the pulse width of the drive signal to the gates of the two input transistors. Such an approach can regulate the input power to the converter while also mitigating switching loss.

A control scheme of that kind is described in J. Delhotal et al, "Design and Control Methodology for Improved Operation of a HV Bipolar Switched Capacitor Converter," *IEEE Workshop on Wide Bandgap Power Devices and Applications (WiPDA)*, Albuquerque, N. Mex., October 2017, hereinafter "Delhotal 2017". The same technique is also described in J. Stewart et al., "Design and Evaluation of a Hybrid Switched Capacitor Circuit with Wide-Bandgap Devices for Compact MVDC PV Power Conversion," *Photovoltaic Specialists Conference (PVSC)*, IEEE-PVSC 44.2017, Washington, D.C. June 2017, and in J. Stewart et al., "Design and Evaluation of Hybrid Switch Capacitor Converters for High Voltage, High Power Density Applications," *Applied Power Electronics Conference (APEC)*, San Antonio, Tex., March 2018.

In the control scheme reported in Delhotal 2017, the MOSFET is switched on as the inductor current rises through the inductor-current zero crossing (when the switch voltage is also near zero), and then the MOSFET is switched off when a reference peak current is reached. Accordingly, the switching pattern has a duty cycle defined as the on-time of the MOSFET, expressed as a fraction of one complete switching period. The optimum gate drive signal is defined by the duty cycle that gives the best conversion efficiency. It can be calculated from a measurement of the current in one of the inductors and a measurement of the node voltage at the drain of one of the switches.

If active control is desired, a current probe can provide the error signal in a feedback loop for maintaining a near-optimal gate drive signal. The switching frequency can also be placed under feedback control.

Delhotal 2017, cited above, provides a theoretical analysis of the switching behavior. The analysis provides the following expression for the on-time $T_{m1}$ of the MOSFET:

$$T_{m1} = I_{L1,pk}(2L/V_S),$$

where $V_S$ is the source voltage for the converter, L is the input inductance, and $I_{L1,pk}$ is the peak current. The same analysis provides the following expression for the total period of the switch cycle $T_{sw}$:

$$T_{sw} = \left[\frac{2L}{V_S} + \frac{2L(N+1)}{V_{out} - V_S(N+1)}\right]I_{L,pk} + \frac{1.375\tau_{CP}}{V_S(N+1)}V_{out},$$

where N is the number of converter stages, $V_{out}$ is the output voltage, and the charge-pump time constant $\tau_{CP}$ can be calculated from the number of stages, the capacitor values, the capacitor equivalent series resistance values, and an equivalent resistance value attributed to the diodes.

In an example, equal capacitances are chosen so that the output voltage divides out approximately equally across each stage of the diode-and-capacitor ladder. Accordingly, for the bipolar configuration with N stages on each rail, the steady-state average voltage $V_C$ of the capacitor proximal to diode D1 is given by $$V_C = V_{out}/2(N+1).$$

Thus, increasing the number N of stages will reduce the likelihood of voltage breakdown across individual components. However, there is a tradeoff because at large values of f/V, efficiency drops and the stress on the components of the first few stages of the ladder increases.

As is known in the art, the use of wide bandgap switching devices in power converters can potentially reduce the converter's footprint by increasing the switching frequency and reducing passive component sizes, while permitting high-voltage operation with high efficiency. Examples of wide bandgap devices are transistors and diodes based on silicon carbide (SiC), gallium nitride (GaN), and aluminum gallium nitride (AlGaN).

A seven-stage GaN-based flying-capacitor multilevel boost converter was proposed in Z. Liao et al., "A GaN-based Flying-Capacitor Multilevel Boost Converter for High Step-up Conversion", 2016 *Energy Conversion Conference and Exposition (ECCE)*, Milwaukee, Wis., 18-22 Sep. 2016, hereinafter "Liao 2016". As reported there, a gain of more than 9 was achieved by boosting from 100 V to 914 V with 750 W output power and 92.7% efficiency. Although the circuit of Liao 2016 provided good gain and efficiency as well as high power density, the control was complex, requiring a total of six active switches.

A high-gain switched capacitor topology controlled using only a single switch is discussed in M. D. Seeman, "A Design Methodology for Switched Capacitor DC-DC Converters", *Dissertation for Electrical Engineering and Computer Sciences*, University of California at Berkeley, UCB/EECS-2009-78, May 21, 2009, p. 112-116, hereinafter "Seeman 2009". The topology reported there can be thought of as a unipolar hybrid switched capacitor circuit (HSCC). Like the circuit of FIG. 2, it uses a single controlled switch along with several diodes and capacitors configured as a power converter.

Although there are similarities to the embodiments described here, the power converter of Seeman 2009 is not a grid-scale power converter, as it is only meant to operate at power levels and voltage levels suitable for small-scale robotic aircraft, wireless sensor nodes, microprocessors, and the like. Among the features we have added is the dual rail configuration of FIG. 6, which doubles the output voltage while making it possible to use available components that have ratings of only about half what is needed for a grid-scale power converter. We have also conceived of the multiple rail stacking configuration of FIG. 8. This configuration enables converter operation at output power and voltage levels that are far beyond the power and voltage breakdown ratings of the ladder diodes and capacitors. In addition, we have chosen an effective switching frequency and have sized our components appropriately.

Another added feature is the power-flow control technique of Delhotal 2017, discussed above.

As noted above, wide bandgap switching devices have advantages that are pertinent to the circuits described here.

Figure 9:
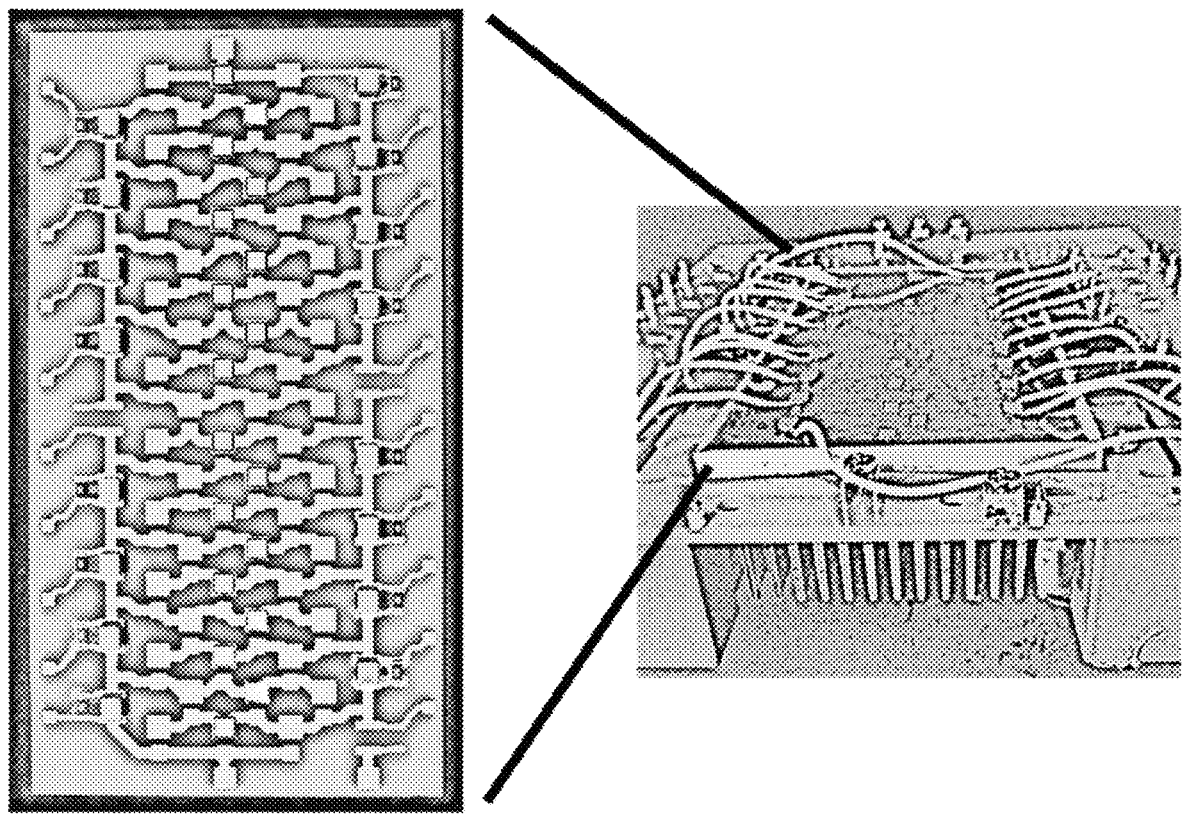
FIG. 9 is a view of an example substrate with a heat sink on the back of the substrate for cooling.

One innovation that we have made relative to the HSCC of Seeman 2009 is an aluminum nitride (AlN) substrate for the circuit, using direct-bonded copper (DBC) traces and planes. FIG. 9 is a view of such a substrate. We successfully tested an AlN substrate in a prototype hardware device similar to the device of Example 1, below. Specifically, the high voltage section of the prototype used DBC printed traces on aluminum nitride (AlN) in order to utilize a substrate material that is electrically insulating and has high thermal conductivity. The thermal conductivity of the AlN substrate was utilized for efficient cooling by placing a large, finned, aluminum heat sink on the back of the substrate and cooling it with blown air from a fan. The inset to FIG. 9 is a cutaway view notionally illustrating such a cooling arrangement.

AlN is especially advantageous in applications involving the conversion of grid-level power because its high thermal conductivity (70-210 W/m° K for polycrystalline AlN) lends itself to better thermal management. DBC printed technology is also advantageous for electronic applications involving high voltage standoff and high operating temperatures. In the embodiment described here, for example, the entire converter needs to dissipate up to 500 W of heat over a small physical footprint, underscoring the need for excellent thermal conductivity.

One possible alternative to AlN as a substrate material is alumina ($Al_2O_3$). Like AlN, alumina is an electrical insulator with a relatively high thermal conductivity (30 W/m° K). Although it is somewhat less thermally conductive than AlN, alumina may be preferred for some applications because unlike AlN, alumina has a long history of use as a substrate for high performance electronic circuitry.

Another possible alternative to AlN as a substrate material is diamond. Although more expensive than other candidate materials, diamond is attractive because it has extremely high thermal conductivity and dielectric strength.

It should be noted in this regard that we were surprised by our discovery that conductive cooling through an aluminum nitride substrate can be highly effective. That has led us to believe that all components that switch power, including the boost converter, its inductors, and even large film capacitors can be jointly placed on the same AlN substrate (or other electrically insulating but highly thermally conductive substrate, such as one of alumina or diamond) and still effectively cooled.

Example 1

We built a five-stage, bipolar hardware prototype using SiC diodes, SiC transistors, two 16.2 µH inductors, and a 25 kΩ load resistor. Each stage capacitor was a 1 µF film capacitor in parallel with a 0.1 µF multilayer ceramic capacitor (MLCC). The film capacitors provided high capacitance per voltage rating and capacitance stability at high voltage. The MLCCs were included to allow fast switching of the diodes, as they have lower equivalent-series-inductance than the film capacitors.

We took measurements at five different input power levels $P_{in}$, and we obtained gains of 18.77-21.44 and efficiencies Eff of 96.93%-97.88%. (The reported gains and efficiencies are for the overall device, including the input-stage boost converter.) Notably, the converter boosted an input of 460 V to an output of 8.63 kV at a power level of 3.63 kW with an efficiency of almost 97%.

Our measured data are presented in Table 1, below, where $V_S$ represents source voltage, $I_{L,pk}$ represents the peak inductor current, $V_{out}$ represents the output voltage, $f_{sw}$ represents the switching frequency, and $I_{L,min}$ represents the minimum inductor current:

TABLE 1

| Expt. | $V_s$ (V) | $I_{L,pk}$ (A) | $V_{out}$ (V) | $P_{in}$ (W) | Eff (%) | Gain | $f_{sw}$ (kHz) | $I_{L,min}$ (A) |
|---|---|---|---|---|---|---|---|---|
| 1 | 100 | 5.52 | 2142 | 190.4 | 97.88 | 21.44 | 310 | −1.44 |
| 2 | 200 | 10.5 | 4247 | 766.2 | 97.56 | 21.26 | 330 | −2.56 |
| 3 | 300 | 14.1 | 5911 | 1543.8 | 97.64 | 19.72 | 364 | −3.12 |
| 4 | 400 | 18.6 | 7788 | 2855.6 | 97.63 | 19.47 | 365 | −3.60 |
| 5 | 460 | 20.3 | 8630 | 3632.6 | 96.93 | 18.77 | 375 | −3.92 |

The dimensions of the prototype were approximately 15.7"×7.4"×2", yielding a volume of 232 in³ (3,808 cm³), with a demonstrated volume power density of about 15.5 W/in³ (0.945 W/cm³) and areal power density of about 31 W/in² (1.89 W/cm²) based on the peak power that we measured. (The two-inch height dimension corresponds to the height of the film capacitors.)

We believe that even greater efficiencies than those that we demonstrated can be achieved through such approaches as parameter optimization, use of vertical GaN diodes, adjustments to the circuit topology, and advanced packaging techniques. (It should be noted that this prototype version was fabricated on a printed circuit board, and not on a substrate such as direct printed copper—DBC—over aluminum nitride.) Accordingly, we believe that with inputs (into the booster stage) of 100V to 500V and more and input power levels of 150 W to 4 kW and more, it will be possible to achieve gains of 15-25 and more at efficiencies exceeding 95% and in at least some cases exceeding 98%.

We also believe that with advanced packaging technology and improved thermal management including measures like backside cooling, DBC, and aluminum nitride substrates, the converter size can be reduced, leading to areal power densities exceeding 50 W/in².

Example 2

We built a bipolar hardware prototype in which the number of stages was selectable up to a maximum of seven. The prototype used SiC diodes, SiC transistors, two 58.8 µH inductors, and a 10 kΩ load resistor. The stage capacitors were 0.1 µF MLCCs. The circuit was mounted on conventional printed circuit board. All the power semiconductors used individual ceramic heat sinks for high-voltage holdoff, and cutouts were placed in the circuit board near large voltage differentials to prevent surface tracking. Front-side air cooling was provided by a fan.

Our measured data are presented in Table 2, below. The duty cycle was varied to optimize the power flow through the converter.

TABLE 2

| Operating Conditions | | Hardware Results | | | |
|---|---|---|---|---|---|
| Input Voltage (V) | Duty cycle (D) | Output Voltage (V) | Output Power (W) | Efficiency (%) | Gain |
| 330.1 | 0.33 | 5017 | 532 | 96.55 | 15.2 |
| 330.2 | 0.59 | 5006 | 1051 | 96.30 | 15.2 |
| 330.1 | 0.72 | 5004 | 1569 | 94.13 | 15.2 |
| 440.4 | 0.34 | 6678 | 975 | 95.88 | 15.2 |
| 440.2 | 0.66 | 6663 | 1952 | 95.56 | 15.1 |
| 530.5 | 0.35 | 8000 | 1440 | 94.98 | 15.1 |
| 600.1 | 0.46 | 10055 | 2574 | 95.32 | 16.8 |

Significantly, our hardware prototype was able to drive a resistive load at 10 kV and 2.57 kW with 95.3% conversion efficiency.

We claim:

1. A hybrid switched capacitor power converter having an output voltage and having a conversion capacity of at least 0.5 kW, comprising a switched input-stage boost converter followed by a capacitor-and-diode ladder circuit, wherein:
   the switched input-stage boost converter is connected to the capacitor-and-diode ladder circuit through an ac transformer;
   the ladder circuit comprises a stack of rail pairs in each of which a negative rail is paired with a corresponding positive rail;
   each said rail has a plurality of stages;
   each of the rail pairs has a current return line that serves as a floating ground;
   the output voltage comprises a voltage drop between a positive rail output and a corresponding negative rail output; and
   the rail pairs are stacked in series such that the output voltage of the power converter is obtained by summing the voltage drops between the positive and negative outputs of the respective rail pairs.

2. A hybrid switched capacitor power converter according to claim 1, wherein:
   at least the ladder circuit is integrated on a front surface of a planar substrate and conductively coupled through the planar substrate to a cooling arrangement on a back surface thereof.

3. The power converter of claim 2, wherein the ladder circuit is integrated on the front surface of the planar substrate without front-surface heat sinks.

4. The power converter of claim 2, wherein each said rail has at most seven stages.

5. The power converter of claim 2, wherein the planar substrate is a high-thermal-conductivity substrate comprising aluminum nitride, alumina, or diamond.

6. The power converter of claim 2, adapted to produce an output voltage of at least 5 kV at a power level of at least 0.5 kW.

7. The power converter of claim 1, wherein:
the input-stage boost converter comprises an inductor or a transformer having a primary coil, and further comprises at least one switching element; and
the power converter further comprises a controller adapted to switch the at least one switching element on at a zero crossing of a current in the inductor or transformer primary coil and to switch the switching element off when a reference peak current value in the inductor or transformer primary coil is reached.

8. The power converter of claim 1, wherein:
the input-stage boost converter comprises at least one switching element;
the power converter further comprises a controller adapted to switch the switching element at a switching frequency; and
the power converter further comprises a feedback loop for controlling the switching frequency.

9. The power converter of claim 2, adapted to achieve voltage gains of at least 15 with power-conversion efficiencies of at least 95% at power levels of at least 0.5 kW.

10. The power converter of claim 2, wherein the back-surface cooling arrangement comprises an air-cooled, metal-finned heat sink.

11. The power converter of claim 2, wherein the back-surface cooling arrangement comprises a liquid-cooled heat exchanger.

12. The power converter of claim 1, wherein the switched input-stage boost converter is switched by a driver circuit, and the driver circuit comprises a multiple transistor bridge.

13. A method of DC-to-DC power conversion, comprising:
applying an input voltage of at least 200V to input terminals of a boost converter;
converting the input voltage to an output voltage of at least 1000V with an efficiency of at least 90% by applying gain in the boost converter and further gain in a capacitor-and-diode ladder circuit connected downstream of the boost converter;
cooling at least the capacitor-and-diode ladder circuit by conducting waste heat through a planar substrate to a back side of the planar substrate and removing the waste heat from the back side of the planar substrate; and
delivering a converted output power of at least 0.5 kW to a load connected across output terminals of the ladder circuit, wherein:
the capacitor-and-diode ladder circuit comprises a stack of rail pairs,
each rail pair is constituted by a positive rail having a positive output terminal and a negative rail having a negative output terminal,
each rail pair has a rail-pair voltage between its positive and negative output terminals,
the converted output voltage is a sum of the respective rail-pair voltages,
the boost converter is connected to the capacitor-and-diode ladder circuit through an ac transformer;
each of the rail pairs has a current return line that serves as a floating ground;
the rail pairs are stacked in series such that the converted output voltage is obtained by summing the voltage drops between the positive and negative output terminals of the respective rail pairs.

14. The method of claim 13, wherein the converting of the input voltage to the output voltage comprises switching the boost converter at a switching frequency.

15. The method of claim 14, wherein the switching of the boost converter comprises controlling at least one switching element to turn on at a zero crossing of an inductor current in an inductor or transformer primary coil of the boost converter and to turn off when a reference peak current in the inductor or transformer primary coil is reached.

16. The method of claim 13, wherein the converting of the input voltage to the output voltage comprises switching, at a switching frequency, a multiple transistor bridge that drives the boost converter.

* * * * *